(12) United States Patent
Huber

(10) Patent No.: US 9,810,993 B2
(45) Date of Patent: Nov. 7, 2017

(54) MIRROR, IN PARTICULAR FOR A MICROLITHOGRAPHIC PROJECTION EXPOSURE APPARATUS

(71) Applicant: CARL ZEISS SMT GMBH, Oberkochen (DE)

(72) Inventor: Peter Huber, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/144,982

(22) Filed: May 3, 2016

(65) Prior Publication Data

US 2016/0246179 A1    Aug. 25, 2016

Related U.S. Application Data

(63) Continuation of application No. PCT/EP2014/072576, filed on Oct. 21, 2014.

(30) Foreign Application Priority Data

Nov. 4, 2013   (DE) .................... 10 2013 222 330

(51) Int. Cl.
*G03F 7/20*    (2006.01)
*G02B 5/08*    (2006.01)
(Continued)

(52) U.S. Cl.
CPC ............ *G03F 7/702* (2013.01); *C23C 8/20* (2013.01); *C23C 28/322* (2013.01);
(Continued)

(58) Field of Classification Search
CPC ........ G02B 1/14; G02B 5/0816; G02B 5/085; G02B 5/0891; G02B 5/28; G03F 7/702;
(Continued)

(56) References Cited

U.S. PATENT DOCUMENTS 4,856,887 A  *  8/1989  Wakugawa  ............ C04B 41/009
                                                                    359/883
2004/0030814 A1    2/2004  Kamm et al.
(Continued)

FOREIGN PATENT DOCUMENTS

DE              10235255  A1     2/2004
DE         102004062289  A1     7/2006
(Continued)

OTHER PUBLICATIONS

Innternational Search Report and Written Opinion in counterpart International Application No. PCT/EP2014/072576, dated Jan. 29, 2015.
(Continued)

*Primary Examiner* — Steven H Whitesell Gordon
(74) *Attorney, Agent, or Firm* — Edell Shapiro & Finnan, LLC

(57) ABSTRACT

A mirror, in particular for a microlithographic projection exposure apparatus, has an optically effective surface (10a), a mirror substrate (11) and a reflection layer stack (12) configured to reflect electromagnetic radiation that is incident on the optically effective surface. A metallic diffusion barrier layer (13) is arranged on that side of the reflection layer stack which faces toward the optically effective surface, and a stabilization layer (14) is arranged on the side of the diffusion barrier layer that faces toward the optically effective surface (10a). The stabilization layer reduces deformation of the diffusion barrier layer compared to an analogous structure without such a stabilization layer upon irradiation of the optically effective surface with electromagnetic radiation. The stabilization layer has a porosity, a relative density of which is no more than 80%, where the relative density is defined as the ratio between geometric density and true density.

18 Claims, 3 Drawing Sheets

(51) Int. Cl.
  *G02B 5/28* (2006.01)
  *G21K 1/06* (2006.01)
  *C23C 8/20* (2006.01)
  *C23C 28/00* (2006.01)
  *G02B 1/14* (2015.01)

(52) U.S. Cl.
  CPC .............. *C23C 28/341* (2013.01); *G02B 1/14* (2015.01); *G02B 5/085* (2013.01); *G02B 5/0816* (2013.01); *G02B 5/0891* (2013.01); *G02B 5/28* (2013.01); *G03F 7/70316* (2013.01); *G03F 7/70958* (2013.01); *G03F 7/70983* (2013.01); *G21K 1/062* (2013.01); *G21K 2201/067* (2013.01)

(58) Field of Classification Search
  CPC ............. G03F 7/70316; G03F 7/70958; G03F 7/70983
  See application file for complete search history.

(56) References Cited

U.S. PATENT DOCUMENTS

| | | | |
|---|---|---|---|
| 2004/0101710 A1 | 5/2004 | Prisbrey | |
| 2004/0105145 A1 | 6/2004 | Myers | |
| 2005/0276988 A1* | 12/2005 | Trenkler | B82Y 10/00 428/432 |
| 2006/0127780 A1 | 6/2006 | Chandhok et al. | |
| 2008/0088916 A1 | 4/2008 | Benoit et al. | |
| 2010/0027107 A1 | 2/2010 | Yakshin et al. | |
| 2010/0190113 A1 | 7/2010 | Murakami et al. | |
| 2012/0200913 A1 | 8/2012 | Van Kampen et al. | |
| 2012/0219890 A1 | 8/2012 | Mikami | |
| 2014/0211178 A1 | 7/2014 | Ehm et al. | |

FOREIGN PATENT DOCUMENTS

| | | |
|---|---|---|
| DE | 102008007387 A1 | 8/2008 |
| DE | 102009043824 A1 | 2/2011 |
| DE | 102011083461 A1 | 3/2013 |
| DE | 102012202850 A1 | 8/2013 |
| EP | 1717609 A1 | 11/2006 |
| EP | 2116872 A1 | 11/2009 |
| EP | 2509102 A1 | 10/2012 |
| JP | 2006170916 A | 6/2006 |
| NO | 2014139694 A1 | 9/2014 |
| WO | 2011068223 A1 | 6/2011 |
| WO | 2013124224 A1 | 8/2013 |

OTHER PUBLICATIONS

Office Action in corresponding German Application No. 10 2013 222 330.7, dated Mar. 17, 2014, along with an English translation.
International Preliminary Report on Patentability and Written Opinion in counterpart International Application No. PCT/EP2014/072576, dated May 10, 2016.

\* cited by examiner

MIRROR, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2014/072576, which has an international filing date of Oct. 21, 2014, and the disclosure of which is incorporated in its entirety into the present Continuation by reference. The following disclosure is also based on and claims the benefit of and priority under 35 U.S.C. §119(a) to German Patent Application No. DE 10 2013 222 330.7, filed Nov. 4, 2013, which is also incorporated in its entirety into the present Continuation by reference.

FIELD OF THE INVENTION

The invention relates to a mirror, in particular for a microlithographic projection exposure apparatus.

BACKGROUND

Microlithography is used for producing microstructured components, such as for example integrated circuits or LCDs. The microlithography process is carried out in a so-called projection exposure apparatus having an illumination device and a projection lens. The image of a mask (reticle) illuminated with the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the extreme ultraviolet (EUV) range, i.e. at wavelengths of e.g. approximately 13 nm or approximately 7 nm, owing to the lack of availability of suitable light-transmissive refractive materials, mirrors are used as optical components for the imaging process. Such EUV mirrors have a mirror substrate and a reflection layer stack—constructed from a multiplicity of layer packets—for reflecting the electromagnetic radiation that is incident on the optically effective surface.

In order to avoid damage to the chemically reactive layer materials of the reflection layer stack by way of EUV radiation incident during operation, it is known, inter alia, to apply a metallic diffusion barrier layer onto the reflection layer stack, which metallic diffusion barrier layer can be produced from e.g. Ru (ruthenium), rhodium (Rh), platinum (Pt), silver (Ag) or iridium (Ir) and is sufficiently tight to suppress a diffusion of e.g. oxygen ($O_2$) from the adjacent gaseous phase into the reflection layer stack.

In practice, however, this involves the problem that such a metallic diffusion barrier layer configured to ensure the highest possible reflectivity or lowest possible absorption with a comparatively small layer thickness (of e.g. 1 nm to 2 nm) can mechanically deform under EUV irradiation to the extent that the metallic diffusion barrier layer in question converges in a substantially spherical manner and in the process becomes detached from the adjoining reflection layer stack. This effect, also referred to as "dewetting", is shown merely schematically in FIGS. 3A-3B. In these figures, "32" denotes the reflection layer stack and "33" denotes the diffusion barrier layer, the diffusion barrier layer 33 as shown in FIG. 3B converging upon EUV irradiation to form substantially spherical segment-shaped regions 33a-33d.

The "dewetting" described above has the effect, in turn, that the regions of the reflection layer stack 32 which are affected respectively by the detachment are no longer protected by the diffusion barrier layer 33 from a chemical reaction with the surrounding atmosphere (e.g. oxygen atoms), and a chemical reaction of the reflection layer stack 32 and also an associated significant impairment of the reflection properties of the mirror can take place. Thus, it would be possible to observe a relative loss of reflection on the order of magnitude of 20% in experiments, for example, even given a comparatively low power density of 20 $mW/mm^2$ after an irradiation duration of 200 h.

The problem described above proves to be particularly serious in a typically used reducing (e.g. hydrogen) atmosphere, since in this case the mobility of the atoms located at the surface of the metallic diffusion barrier layer, and thus also the tendency toward "dewetting", is particularly great.

In relation to the prior art, reference is made merely by way of example to DE 10 2009 043 824 A1, DE 10 2011 083 461 A1, JP 2006170916 A, DE 10 2004 062 289 A1, DE 102 35 255 A1, US 2004/0105145 A1 and EP 2 509 102 A1.

SUMMARY

It is an object of the present invention to provide a mirror, in particular for a microlithographic projection exposure apparatus, in which undesired radiation-induced impairments of the reflection properties are avoided particularly effectively.

A mirror according to one formulation of the invention has an optically effective surface, a mirror substrate and a reflection layer stack configured to reflect electromagnetic radiation that is incident on the optically effective surface, a metallic diffusion barrier layer arranged on that side of the reflection layer stack which faces toward the optically effective surface, and a stabilization layer arranged on that side of the diffusion barrier layer which faces toward the optically effective surface. The stabilization layer is configured to reduce deformation of the diffusion barrier layer compared to an analogous structure without the stabilization layer upon irradiation of the optically effective surface with electromagnetic radiation. The stabilization layer has a porosity, such that a relative density, which is defined as the ratio between geometric density and true density, for the stabilization layer is no more than 80%.

In this case, the above-described dewetting effect or the deformation of the diffusion barrier layer is preferably reduced to such an extent that the diffusion barrier is still formed by a closed layer.

The invention uses, in combination with a metallic diffusion barrier layer, a stabilization layer arranged on that side of the diffusion barrier layer which faces toward the optically effective surface of the mirror. This stabilization layer has the effect that, under EUV irradiation, the above-described effect of an, in particular spherical segment-shaped, contraction of the metallic diffusion barrier layer no longer arises on account of the mechanical stabilizing action of the adjoining stabilization layer.

This mechanical stabilizing action can be attributed to the fact that the additional energy input which is required for the mechanical deformation of the diffusion barrier layer and therefore the undesirable "dewetting" thereof from the reflection layer stack owing to the stabilization layer resting on the diffusion barrier layer becomes too great, with the result that the diffusion barrier layer remains in its original, substantially planar shape and thus also the protective action thereof as a diffusion barrier is retained.

In this respect, there is a division of tasks in the combination according to the invention of the metallic diffusion barrier layer, on the one hand, and the stabilization layer, on the other hand, to the effect that the metallic diffusion barrier layer, on account of its comparatively dense structure and its impermeability in particular to oxygen atoms, adequately prevents the diffusion between the surrounding atmosphere and the reflection layer stack, whereas the stabilization layer alone is responsible for the mechanical stabilization or the avoidance of a morphological change in the diffusion barrier layer (in the form of the "dewetting", described in the introduction, from the reflection layer stack). The circumstance mentioned last (i.e. the mechanical stabilization merely to be achieved on account of the stabilization layer) has the effect, in particular, that the latter, as explained in more detail hereinbelow, can be configured with a comparatively low density, in particular in porous form, and therefore with only low absorption being generated.

Furthermore, on account of the diffusion barrier action still to be provided by the metallic diffusion barrier layer alone in the layer construction according to the invention, the material selection for this layer can be made merely taking this avoidance of diffusion into consideration, without having to allow for any fundamental tendency of the material in question toward "spherical segment-shaped" contraction or "dewetting" under EUV irradiation.

As a result, even in the case of relatively high power densities (of e.g. more than 20 mW/mm$^2$) and also even in a reducing (e.g. hydrogen) atmosphere, it is thereby possible to reliably avoid damage to the reflection layer stack caused by EUV radiation and also an associated impairment of the reflection properties of the mirror.

According to the invention, the stabilization layer has a porosity, such that the relative density, which is defined as the ratio between geometric density and true density (also referred to as "bulk density"), for said stabilization layer is no more than 80%.

According to one embodiment, the relative density, which is defined as the ratio between geometric density and true density, is no more than 70%.

According to one embodiment, the stabilization layer comprises at least one material selected from the group consisting of silicon (Si), molybdenum (Mo), boron (B), carbon (C), ruthenium (Ru), rhodium (Rh) and also nitrides.

According to one embodiment, the stabilization layer comprises a carbide, in particular silicon carbide (SiC) or boron carbide ($B_4C$).

According to a further embodiment, the stabilization layer comprises a nitride, which is advantageous in view of the comparatively low absorption of $N_2$.

According to one embodiment, the stabilization layer is formed from atoms bonded in a covalent bond.

According to one embodiment, the stabilization layer has a thickness of no more than 4 nm, in particular of no more than 2 nm.

According to one embodiment, the diffusion barrier layer comprises at least one material selected from the group consisting of ruthenium (Ru), rhodium (Rh), niobium (Nb), zirconium (Zr), platinum (Pt), iridium (Ir) and silver (Ag).

In accordance with one embodiment, the diffusion barrier layer has a thickness in the range of 0.3 nm to 2 nm, in particular a thickness in the range of 0.3 nm to 1.5 nm.

The mirror can be designed in particular for an operating wavelength of less than 30 nm, in particular less than 15 nm. However, the invention is not in principle restricted thereto either and, in further embodiments, can also be realized in a mirror designed for operating wavelengths in the VUV range (e.g. less than 200 nm).

The invention furthermore relates to an optical system of a microlithographic projection exposure apparatus, in particular an illumination device or a projection lens, wherein the optical system comprises at least one mirror having the features described above.

Further configurations of the invention can be gathered from the description and the dependent claims.

The invention is explained in greater detail below on the basis of exemplary embodiments illustrated in the accompanying figures.

DETAILED DESCRIPTION

Figure 1:
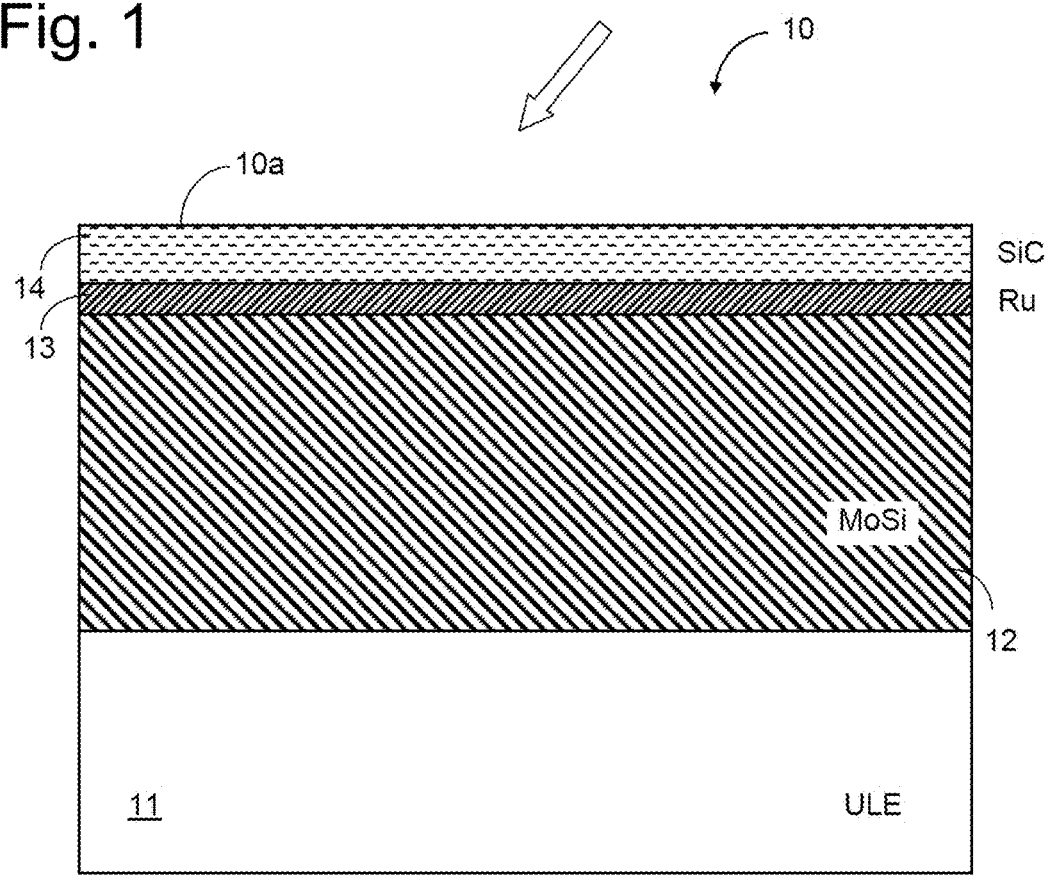
FIG. 1 shows a schematic illustration for elucidating the construction of a mirror according to an exemplary embodiment of the invention.

FIG. 1 shows a schematic illustration for elucidating the construction of a mirror 10 according to the invention in one embodiment of the invention. The mirror 10 can be in particular an EUV mirror of an optical system, in particular of the projection lens or of the illumination device of a microlithographic projection exposure apparatus.

Reference is made to the fact that only the layers relevant in conjunction with the explanation of the present invention are depicted in the layer construction of the mirror 10 depicted in FIG. 1 and that the mirror 10 can also have one or more additional layers for providing different functionalities (e.g. adhesive layers, etc.) in embodiments of the invention.

According to FIG. 1, the mirror 10 initially comprises a mirror substrate 11. Suitable mirror substrate materials are e.g. titanium dioxide ($TiO_2$)-doped quartz glass, wherein the materials sold under the trademarks ULE® or Zerodur® can be used, merely by way of example and without the invention being restricted thereto.

Furthermore, the mirror 10 comprises, in a manner known per se in principle, a reflection layer stack 12, which, in the embodiment illustrated, merely by way of example, comprises a molybdenum-silicon (Mo—Si) layer stack (and, if appropriate, diffusion barrier layers, etc.). Without the invention being restricted to specific configurations of this reflection layer stack 12, one suitable, exemplary construction can comprise, for instance, 50 plies or layer packets of a layer system comprising molybdenum (Mo) layers having a layer thickness of in each case 2.8 nm and silicon (Si) layers having a layer thickness of in each case 4.2 nm.

In accordance with FIG. 1, a layer 13 composed of ruthenium (Ru) is arranged on the reflection layer stack 12, which layer (without the invention being restricted thereto) can have a typical thickness in the range of 0.3 nm to 2 nm.

Figure 3A:
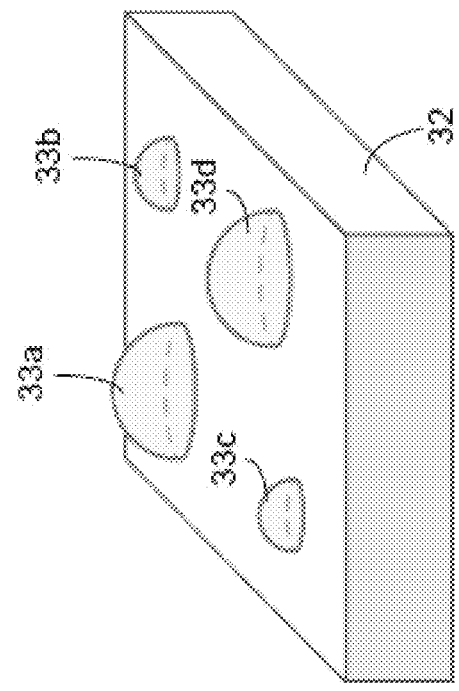
FIGS. 3A and 3B show a schematic illustration for elucidating a problem underlying the invention.
Figure 3B:
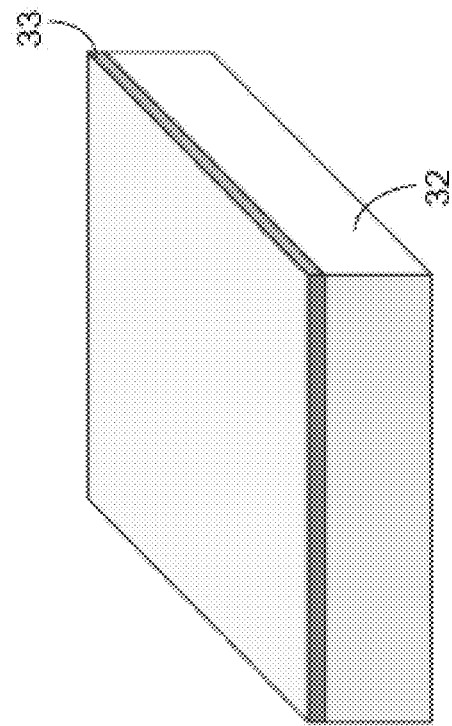

If the metallic diffusion barrier layer 13 is arranged as the topmost layer in the mirror 10, there would be the risk that, owing to the EUV irradiation which arises during operation, the effect of "dewetting" from the adjoining reflection layer stack 12, as described in the introduction with reference to FIG. 3, would arise. As a result, the regions of the metallic diffusion barrier layer 13 which contract in a substantially spherical segment-shaped manner would then only form incomplete protection of the reflection layer stack 12 from a chemical reaction with the adjoining atmosphere. The reflection properties of the mirror 10 and thus also the optical properties of the microlithographic projection exposure apparatus comprising the mirror 10 would thereby be impaired.

To avoid the above disadvantages, the mirror 10 as shown in FIG. 1 has, on that side of the metallic diffusion barrier layer 13 which faces toward the optically effective surface 10a, a stabilization layer 14, which is produced in the exemplary embodiment from silicon carbide (SiC) in a thickness of, e.g., less than 4 nm. As already described further above, this stabilization layer 14 prevents the mechanical deformation of the diffusion barrier layer 13 in the course of the mechanical stabilization thereof, and thus the dewetting effect described above with reference to FIG. 3. In this case, the dewetting effect is preferably reduced to such an extent that the diffusion barrier is still formed by a closed layer.

With respect to the combination of diffusion barrier layer 13 and stabilization layer 14, the invention is not restricted to the selection of material and layer thickness made in the specific exemplary embodiment. Instead, the two layers in question can also be formed from other suitable materials and in other thicknesses, it being possible for the material selection to be optimized with a view to the following functionalities which are to be provided:

An important function of the diffusion barrier layer 13 is to avoid a chemical reaction between the layer materials of the reflection layer stack 12, on the one hand, and the atmosphere surrounding the mirror 10 (e.g. the oxygen atoms present therein), on the other hand, for which purpose a diffusion of e.g. oxygen atoms between the atmosphere surrounding the mirror 10 and the reflection layer stack 12 has to be prevented. From this—and also taking into account the further circumstance that the problem relating to the "dewetting effect" which exists per se in the case of a thin metallic diffusion barrier layer under EUV irradiation is already eliminated on account of the mechanical stabilization of the diffusion barrier layer 13 achieved by the stabilization layer 14 according to the invention—the optimum choice which arises for the diffusion barrier layer 13 is a configuration with a comparatively small layer thickness, e.g. in the range of 0.3 nm to 2 nm, and made of a metal such as ruthenium (Ru), rhodium (Rh), niobium (Nb), zirconium (Zr), platinum (Pt), iridium (Ir) or silver (Ag). Noble metals (such as e.g. ruthenium) are particularly suitable, since these react only to a small degree with the oxygen typically present in the surrounding atmosphere.

With respect to the stabilization layer 14, what matters by contrast in the selection of a suitable material and layer thickness is the mechanical stabilizing action alone, it also being the case that a configuration of the stabilization layer 14 as a porous layer with a comparatively small geometric density is suitable, in particular on account of the circumstance that chemical reactions between the layer materials of the reflection layer stack 12 and the atmosphere surrounding the mirror 10 are prevented by the diffusion barrier layer 13 in the construction according to the invention. In this respect, "geometric density" is understood to mean the density of a porous solid body based on the volume including the enclosed pores, where furthermore the "relative density" is defined as the quotient of the geometric density and the true density (also referred to as "bulk density"). This porosity is advantageous in view of the desirable minimization of absorption losses for the incident EUV radiation and can be set, e.g., to a relative density of at most 80%, in particular at most 70%, by suitably setting the parameters for the layer deposition during the production of the mirror 10 as a whole. With respect to the lowest possible absorption of the EUV radiation and also the desired mechanical rigidity of the stabilization layer 14, and furthermore also to the reaction with air or oxygen which is to be avoided where possible, a suitable material for the stabilization layer 14 is, e.g., a carbide, in particular silicon carbide (SiC) or boron carbide ($B_4C$).

Figure 2:
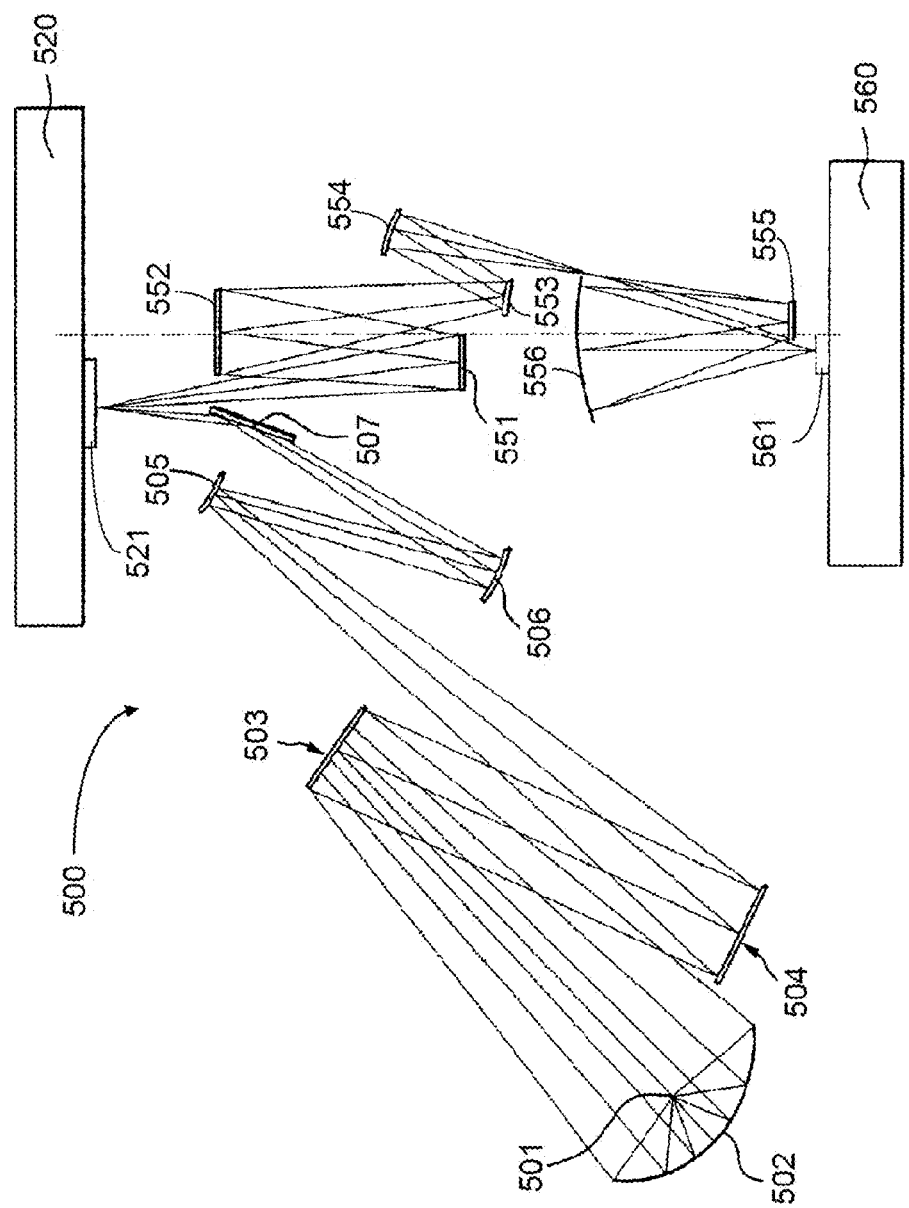
FIG. 2 shows a schematic illustration of an exemplary construction of a microlithographic projection exposure apparatus.

FIG. 2 shows a schematic illustration of one exemplary projection exposure apparatus which is designed for operation in the EUV and in which the present invention can be realized.

In accordance with FIG. 2, an illumination device in a projection exposure apparatus 500 designed for EUV comprises a field facet mirror 503 and a pupil facet mirror 504. The light from a light source unit comprising a plasma light source 501 and a collector mirror 502 is directed onto the field facet mirror 503. A first telescope mirror 505 and a second telescope mirror 506 are arranged in the light path downstream of the pupil facet mirror 504. A deflection mirror 507 is arranged downstream in the light path and directs the radiation that is incident on it onto an object field in the object plane of a projection lens comprising six mirrors 551-556. A reflective structure-bearing mask 521 on a mask stage 520 is arranged at the location of the object field and is imaged into an image plane with the aid of the projection lens, in which image plane is situated a substrate 561 coated with a light-sensitive layer (photoresist) on a wafer stage 560.

On account of the fact that the invention particularly effectively avoids damage to, or the influencing of the reflection properties of, the mirror configured according to the invention which is caused by the EUV irradiation, the realization of the invention in particular in mirror positions with a comparatively high surface power density of the EUV radiation is suitable, this typically being given e.g. for the pupil facet mirror 504 within the illumination device of the projection exposure apparatus 500 (on account of the focusing achieved by way of the field facet mirror 503). A further possible application is also provided by the field facet mirror 503 itself, owing to its positioning in the initial portion of the illumination device.

Within the projection lens of the projection exposure apparatus 500, the first mirrors 551 and 552 in respect of the optical beam path in particular are suitable for realization. The invention is not, however, restricted to the application to the aforementioned mirrors, and therefore in principle it is also possible for other mirrors to be configured in the manner according to the invention.

Even though the invention has been described on the basis of specific embodiments, numerous variations and alternative embodiments are evident to the person skilled in the art, e.g. through combination and/or exchange of features of individual embodiments. Accordingly, such variations and alternative embodiments would be evident to those skilled in the art and are concomitantly encompassed by the present invention. The scope of the invention is restricted only within the meaning of the appended patent claims and equivalents thereof.

What is claimed is:

1. A mirror having an optically effective surface, comprising a mirror substrate;

a reflection layer stack configured to reflect electromagnetic radiation that is incident on the optically effective surface;

a metallic diffusion barrier layer arranged on a side of the reflection layer stack that faces toward the optically effective surface; and a stabilization layer arranged on a side of the diffusion barrier layer that faces toward the optically effective surface, wherein the stabilization layer reduces deformation of the diffusion barrier layer compared to an analogous mirror structure of the mirror without such a stabilization layer upon irradiation of the optically effective surface with electromagnetic radiation; and wherein the stabilization layer has a porosity with a relative density, which is defined as a ratio between geometric density and true density, of at most 80% and is configured to decrease the absorption of electromagnetic radiation by the stabilization layer compared to an analogous layer structure having a higher true density.

2. The mirror as claimed in claim 1, wherein the relative density, which is defined as the ratio between geometric density and true density, for the stabilization layer is at most 70%.

3. The mirror as claimed in claim 1, wherein the stabilization layer comprises at least one material selected from the group consisting of silicon (Si), molybdenum (Mo), boron (B), carbon (C), ruthenium (Ru), rhodium (Rh), and nitrides.

4. The mirror as claimed in claim 1, wherein the stabilization layer comprises a carbide.

5. The mirror as claimed in claim 4, wherein the stabilization layer comprises silicon carbide (SiC) or boron carbide ($B_4C$).

6. The mirror as claimed in claim 1, wherein the stabilization layer comprises a nitride.

7. The mirror as claimed in claim 1, wherein the stabilization layer is formed from atoms bonded in a covalent bond.

8. The mirror as claimed in claim 1, wherein the stabilization layer has a thickness of at most 4 nm.

9. The mirror as claimed in claim 8, wherein the stabilization layer has a thickness of at most 2 nm.

10. The mirror as claimed in claim 1, wherein the diffusion barrier layer comprises at least one material selected from the group consisting of ruthenium (Ru), rhodium (Rh), niobium (Nb), zirconium (Zr), platinum (Pt), iridium (Ir) and silver (Ag).

11. The mirror as claimed in claim 1, wherein the diffusion barrier layer has a thickness in the range of 0.3 nm to 2 nm.

12. The mirror as claimed in claim 11, wherein the diffusion barrier layer has a thickness in the range of 0.3 nm to 1.5 nm.

13. The mirror as claimed in claim 1, configured for an operating wavelength of less than 30 nm.

14. The mirror as claimed in claim 13, configured for an operating wavelength of less than 15 nm.

15. The mirror as claimed in claim 1 and configured as a mirror of a microlithographic projection exposure apparatus.

16. An optical system of a microlithographic projection exposure apparatus comprising at least one mirror as claimed in claim 1.

17. The optical system as claimed in claim 16, configured as an illumination device or as a projection lens.

18. A microlithographic projection exposure apparatus comprising an optical system as claimed in claim 16.

* * * * *